United States Patent
Chuang et al.

(10) Patent No.: US 6,720,820 B1
(45) Date of Patent: Apr. 13, 2004

(54) BLOCK PARALLEL EFUSE APPARATUS BLOWN WITH SERIAL DATA INPUT

(75) Inventors: Yu Meng Chuang, Taoyuan (TW); Mang-Shiang Wang, Taichung (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/340,373

(22) Filed: Jan. 10, 2003

(51) Int. Cl.[7] .............................................. H01H 85/00
(52) U.S. Cl. ...................................... 327/525; 327/526
(58) Field of Search ................................ 327/525, 526; 365/225.7

(56) References Cited

U.S. PATENT DOCUMENTS 6,489,832 B1 * 12/2002 Kim et al. .................. 327/525

* cited by examiner

*Primary Examiner*—Kenneth B. Wells
(74) *Attorney, Agent, or Firm*—Nelson A. Quintero

(57) ABSTRACT

A block parallel efuse apparatus blown with serial data input. The block parallel apparatus includes a high voltage source, efuse circuits, a plurality of multiplex, registers, and an input-output terminal, wherein each efuse circuit includes an efuse, a blown-control terminal, an input terminal, and an output terminal. Each efuse is coupled between the high voltage source and the output terminal of the efuse circuit.

13 Claims, 1 Drawing Sheet

BLOCK PARALLEL EFUSE APPARATUS BLOWN WITH SERIAL DATA INPUT

BACKGROUND OF THE INVENTION

1. Field of the Invention

The present invention relates to a block parallel efuse apparatus blown with serial data input.

2. Description of the Related Art

When an efuse is blown, it takes more time to blow or read serial data. For example, a 0.175 um efuse needs 125 us to be blown in. The more efuses deployed, more time, proportional to the efuses, is required for the fuses to be blown in.

There is thus a need for a block parallel efuse apparatus blown with serial data.

SUMMARY OF THE INVENTION

It is therefore an object of the present invention to shorten the time for blowing efuses.

To achieve the above objects, the present invention provides a block parallel efuse apparatus blown with serial data input.

The block parallel apparatus includes a high voltage source, efuse circuits, a plurality of multiplexes, registers, and an input-output terminal. Each efuse circuit includes an efuse, a blown-control terminal, an input terminal, and an output terminal. Each efuse is coupled between the high voltage source and the output terminal of the efuse circuit. Each blown-control terminal is coupled to a blown-control line. Each multiplex includes a first input terminal, a second input terminal, a control terminal, and an output terminal. The second input terminal of each multiplex is coupled to an output terminal of each corresponding efuse circuit. The control terminal of each multiplex receives a load signal. Each register includes an input terminal, an output terminal, and a control terminal. The input terminal of each register is coupled to the output terminal of each corresponding multiplex. The output terminal of each register is coupled to the first input terminal of another corresponding multiplex and coupled to the input terminal of each corresponding efuse circuit. The control terminal of each register is coupled to a clock line and the input-output terminal for inputting and reading serial data.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF THE INVENTION

Figure 1:
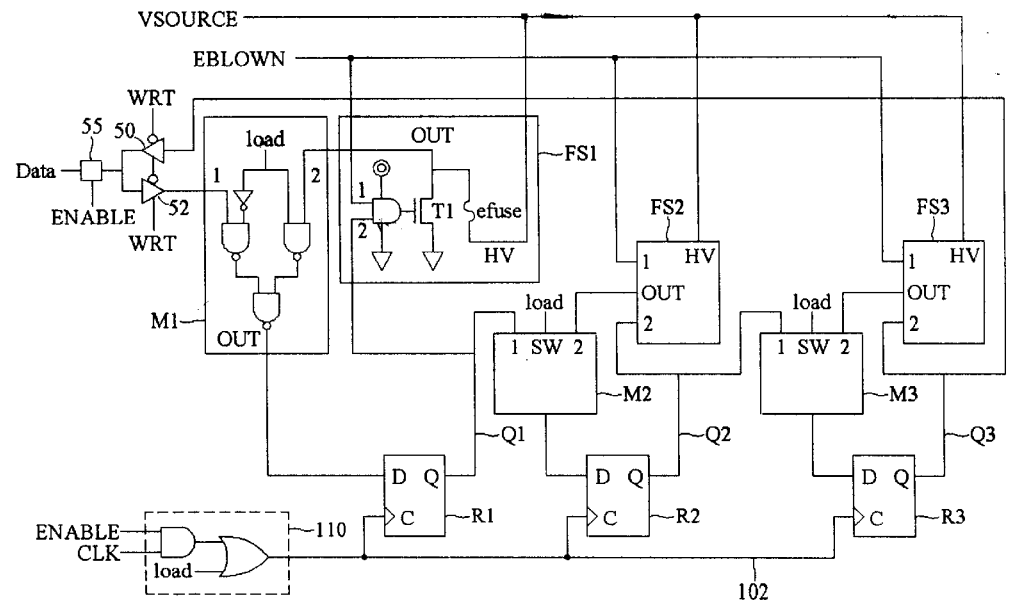
FIG. 1 shows a block diagram of the block parallel efuse apparatus blown with serial data input.

FIG. 1 shows a block diagram of the block parallel efuse apparatus blown with serial data input. As shown in FIG.1, the block parallel efuse apparatus, blown with serial data input 100, includes register R1, R2, and R3, multiplex M1, M2, and M3, and efuse circuits FS1, FS2, and FS3. The registers R1, R2, and R3 can be D type flip-flop.

An input-output terminal 55 is coupled to the first input of the multiplex M1 by the buffer 52. The output of the multiplex M1 is coupled to the input D of the register R1. The output Q1 of the register R1 is coupled to the first input of the multiplex M2. The output of the multiplex M2 is coupled to the input D of the register R2. The output Q2 of the register R2 is coupled to the first input of the multiplex M3. The output of the multiplex M3 is coupled to the input D of the register R3. The output Q3 of the register R3 is coupled to the input of the buffer 50. The output of the buffer 50 is coupled the input-output terminal.

The efuse circuit FS1 includes an AND gate, a switch transistor T1, and a poly efuse. The inputs of the AND gate are the first input and the second input of the efuse circuit FS1 respectively. The output of the AND gate is coupled to the input of the switch transistor T1. The junction of the poly fuse and the switch transistor T1 is the output of the efuse circuit FS1.

The first input of the efuse circuit FS1 is coupled to the blown control line EBLOWN. The second input of the efuse circuit FS1 is coupled to the output Q1 of the register R1. The output of the efuse circuit FS1 is coupled to the second input of the multiplex M1. Poly efuse is coupled to the voltage source at HV. The first input of the efuse circuit FS2 is coupled to the blown control line EBLOWN. The second input of the efuse circuit FS2 is coupled to the output Q2 of the register R2. The output of the efuse circuit FS2 is coupled to the second input of the multiplex M2. Poly efuse is coupled to the voltage source at HV. The first input of the efuse circuit FS3 is coupled to the blown control line EBLOWN. The second input of the efuse circuit FS3 is coupled to the Q3 output of the register R3. The output of the efuse circuit FS3 is coupled to the second input of the multiplex M3. Poly efuse is coupled to the voltage source at HV.

The combinational circuit 110 receives the enable signal ENABLE, the clock signal CLK, and the load signal LOAD. The output of the combinational circuit 110 is coupled to the clock control line 102. The clock control line 102 is coupled to the control terminals C of the register R1, R2, and R3.

When the switch SW of the multiplex M1 is at 0, the first input of the multiplex M1 is coupled to the output of the multiplex M1. When the switch SW of the multiplex M1 is at 1, the second input of the multiplex M1 is coupled to the output of the multiplex M1. The multiplexes M2, M3 have the same function.

When serial data is to be fed to the registers R1, R2, and R3, the load signal is 0, the enable signal is active, the clock signal CLK is fed to the control terminal C of the registers R1, R2, and R3. The input-output terminal 55 is to be fed serial data d1d2d3. The data d1 is passed through the buffer 52, the first input of the multiplex M1, the output of the multiplex M1, and ready at the input D of the register R1. When the clock signal CLK triggers the register R1 at the rising edge of the first clock, the data d1 emerges at the output Q1 of the register R1, at the first input of the multiplex M2, passes through the multiplex M2, and is output at the output of the multiplex M2.

The data d2 is fed at the input-output terminal 55, passes through the buffer 52, the first input of the multiplex M1, the output of the multiplex M1, and is ready at the input D of the register R1. When the clock signal CLK triggers the registers R1 and R2 at the rising edge of the second clock, the data d2 emerges at the output Q1 of the register R1, at the first input of the multiplex M2, passes through the multiplex M2, and is output at the output of the multiplex M2. The data d1 emerges at the output Q2 of the register R2, at the first input of the multiplex M3, passes through the multiplex M3, and is output at the output of the multiplex M3.

The data d3 is fed at the input-output terminal 55, passes through the buffer 52, the first input of the multiplex M1, the output of the multiplex M1, and is ready at the input D of the register R1. When the clock signal CLK triggers the registers R1, R2, and R3 at the rising edge of the third clock, the data d3 emerges at the output Q1 of the register R1, at the first input of the multiplex M2, passes through the multiplex M2, and is output at the output of the multiplex M2. The data d2 emerges at the output Q2 of the register R2, at the first input of the multiplex M3, passes through the multiplex M3, and is output at the output of the multiplex M3. The data d1 emerges at the output Q3 of the register R3, and at the input of the buffer 50.

After some rising edges of the clock signal CLK, the data d1, d2, and d3 emerge at the outputs of the registers R3, R2, and R1, i.e., at the second inputs of the efuse circuits FS3, FS2, and FS3. When the voltage source rises to a required voltage for blowing poly efuse, and the blown control line EBLOWN is active, the transistors T1 are turned on or off according to the data d1, d2, and d3, and the efuse circuits FS1, FS2, and FS3 are blown at once.

The blown-in data dd1, dd2, and dd3 in the efuse circuits FS1, FS2, and FS3 are read serially in order to verify them. Before being read, the blown-in data dd1, dd2, and dd3 must be loaded to the registers R1, R2, and R3. When the load signal is 1, the control terminals C of the register R1, R2, and R3 are enabled, the blown-in data dd1, dd2, and dd3 are loaded to the register R1, R2, R3 at once. The efuse circuit FS1 outputs the blown-in data dd1, passing through the multiplex M1 from the second input to the output, loaded from the input D of the register R1 to the output Q1. The efuse circuit FS2 outputs the blown-in data dd2, passing through the multiplex M2 from the second input to the output, loaded from the input D of the register R2 to the output Q2. The efuse circuit FS3 outputs the blown-in data dd3, passing through the multiplex M3 from the second input to the output, loaded from the input D of the register R3 to the output Q3.

After the load signal is active, the blown-in data dd1, dd2, and dd3 emerge at outputs Q1, Q2, and Q3 respectively.

The blown-in data dd1, dd2, and dd3 are to be read serially at the input-output 55. When the load signal is 0, the enable signal ENABLE is active, the clock signal CLK triggers the control terminals C of the registers R1, R2, and R3.

The register R3 outputs the blown-in data dd1 at Q3, passing through the buffer 52 to the input-output 55. The register R2 outputs the blown-in data dd2 at Q2, passing through the multiplex M3 from the first input to the output. The register R1 outputs the blown-in data dd3 at Q1, passing through the multiplex M2 from the first input to the output.

After the fourth rising edge of the clock signal CLK, the register R3 outputs the blown-in data dd2 at Q3, passing through the buffer 52 to the input-output 55. The register R2 outputs the blown-in data dd3 at Q2, passing through the multiplex M3 from the first input to the output.

After the fifth rising edge of the clock signal CLK, the register R3 outputs the blown-in data dd1 at Q3, passing through the buffer 52 to the input-output 55.

The blown-in data dd1, dd2, and dd3 received by the input-output terminal are compared with the data d1, d2, and d3 for verification.

Figure 2:
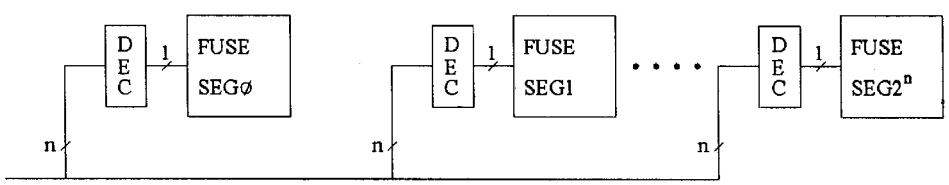
FIG. 2 shows another block diagram of the block parallel efuse apparatus in the present invention.

FIG. 2 shows another block diagram of the block parallel efuse apparatus in the present invention. The efuse circuits are grouped into some segments FUSE-SEG0 FUSE-SEG2" according to current limits of the high voltage source VSOURCE, therefore, blown in segment by segment.

The advantages of the present invention are that data is fed serially, blown in parallelly, can be loaded to registers, read serially, and, according to current limits of the high voltage source VSOURCE, the efuse circuits are grouped into segments, thereby blown in segment by segment Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A block parallel efuse apparatus comprising:
   a high voltage source;
   a clock control line;
   a blown control line;
   a plurality of efuse circuits, each having a efuse, a blown control terminal, an input, and an output, the efuse coupled between the high voltage source and the output, the blown control terminal coupled to the blown control line;
   a plurality of multiplexes, each having a first input and a second input, a control terminal, and an output, the second input coupled to the output of the efuse circuit, the control terminal receiving a load signal;
   a plurality of registers, each having an input, an output, and a control terminal, the input of each register coupled to the output of each corresponding multiplex, the output of each register coupled to the first input of another corresponding multiplex and coupled to the input of the corresponding efuse circuit, the control terminal of each register coupled to the clock control line; and
   an input-output terminal, coupled between the first input of the first multiplex and the output of the last register, thereby data is input or output serially.

2. The block parallel efuse apparatus as claimed in claim 1, wherein when the load signal is the first level, the first input of each multiplex is coupled to the output, the plurality of multiplex and the plurality of registers form a series of registers.

3. The block parallel efuse apparatus as claimed in claim 2, wherein when a clock signal is fed to the clock control line, serial data is fed to the input-output according to the triggering of the clock signal, thereby allowing the plurality of registers to store the serial data.

4. The block parallel efuse apparatus as claimed in claim 3, wherein when the high voltage source is active, the blown control line is active, and the plurality of efuse circuits are blown in according to the serial data at each input at once.

5. The block parallel efuse apparatus as claimed in claim 4, wherein when the load signal is the second level, the second input of each multiplex is coupled to the output, the load signal is fed to the clock control line, and the plurality of registers stores the blown-in serial data.

6. The block parallel efuse apparatus as claimed in claim 5, wherein when a clock signal is fed to the clock control line, the blown-in serial data, stored in the plurality of registers, is read at the input-output according to the triggering of the clock signal.

7. A block parallel efuse apparatus comprising:
   a high voltage source;
   a clock control line;

a blown control line;

a shift register, having a first input, a plurality of second inputs, a clock control terminal, a selective terminal, and a plurality of outputs, the first input being used for feeding serial data, a plurality of second inputs being parallel inputs, the selective terminal receiving a load signal to select the first input or the plurality of inputs to be enabled, the clock control terminal coupled to the clock control line;

a plurality of efuse circuits, each having an efuse, a blown control terminal, an input, and an output, the efuse coupled between the high voltage source and the output, the blown control terminal coupled to the blown control line, the input of each efuse circuit coupled to each corresponding output of the shift register; and an input-output terminal, coupled to the first input of the shift register, thereby data is input or output serially.

8. The block parallel efuse apparatus as claimed in claim 7, wherein the shift register has:

a plurality of multiplexes, each having a first input and a second input, a control terminal, and an output, the second input coupled to each corresponding second input of the shift register, the control terminal coupled to the selective terminal of the shift register; and a plurality of registers, each having an input, an output, and a control terminal, the input of each register coupled to the output of each corresponding multiplex, the output of each register coupled to the first input of another corresponding multiplex, the control terminal of each register coupled to the clock control terminal of the shift register.

9. The block parallel efuse apparatus as claimed in claim 7, wherein when the load signal is the first level, the shift register is loaded with serial data according the clock signal.

10. The block parallel efuse apparatus as claimed in claim 7, wherein when the load signal is the first level, and a clock signal is fed to the clock control line, serial data is fed to the input-output according to the triggering of the clock signal.

11. The block parallel efuse apparatus as claimed in claim 10, wherein when the high voltage source is active, the blown control line is active, and the plurality of efuse circuits are blown in according the serial data at each input at once.

12. The block parallel efuse apparatus as claimed in claim 11, wherein when the load signal is the second level, the plurality of second input of the shift register is active, the shift register stores the blown-in serial data.

13. The block parallel efuse apparatus as claimed in claim 12, wherein when a clock signal is fed to the clock control line, the blown-in serial data, stored in the shift register, is read at the input-output according to the triggering of the clock signal.

* * * * *